United States Patent [19]
Furuya

[11] Patent Number: 4,464,762
[45] Date of Patent: Aug. 7, 1984

[54] MONOLITHICALLY INTEGRATED DISTRIBUTED BRAGG REFLECTOR LASER

[75] Inventor: Kazuhito Furuya, Hazlet, N.J.

[73] Assignee: Bell Telephone Laboratories, Incorporated, Murray Hill, N.J.

[21] Appl. No.: 350,879

[22] Filed: Feb. 22, 1982

[51] Int. Cl.³ .................................................. H01S 3/19
[52] U.S. Cl. .................................. 372/50; 350/96.11; 357/17
[58] Field of Search ................. 372/50, 96; 350/96.11, 350/96.12; 357/17

[56] References Cited

U.S. PATENT DOCUMENTS

| | | | |
|---|---|---|---|
| 3,760,292 | 9/1973 | Kogelnik et al. | 331/94.5 |
| 3,884,549 | 5/1975 | Wang et al. | 350/96 |
| 3,970,959 | 7/1976 | Wang et al. | 331/94.5 |
| 4,144,503 | 3/1979 | Itoh et al. | 372/50 |
| 4,286,838 | 9/1981 | Huignard et al. | 372/50 |

OTHER PUBLICATIONS

Abe et al., "GaInAsP/InP Integrated Laser with But-t-Jointed Built-In Distributed-Bragg-Reflection Waveguide", *Electronics Lett.*, vol. 17, No. 25, Dec. 10, 1981, pp. 945-947.

S. Wang, "Principles of Distributed Feedback and Distributed Bragg-Reflector Lasers," IEEE J. Of Quant. Elect., QE-10, pp. 413-427 (1974).

K. Utaka et al., "1.5-1.6 µm GaInAsP/InP Integrated Twin-Guide Lasers with First-Order Distributed Bragg Reflectors," Elec. Lett., 16, pp. 455-456 (1980).

*Primary Examiner*—James W. Davie
*Attorney, Agent, or Firm*—Gregory C. Ranieri

[57] ABSTRACT

In a heterostructure distributed Bragg reflector laser, at least one multilayer waveguide substantially comprised of a silicon dielectric compound is monolithically integrated with an active semiconductor heterostructure medium. Bragg reflectors are properly disposed within the waveguide.

11 Claims, 4 Drawing Figures

MONOLITHICALLY INTEGRATED DISTRIBUTED BRAGG REFLECTOR LASER

TECHNICAL FIELD

The present invention relates to the field of integrated semiconductor lasers and, particularly, to distributed Bragg reflector arrangements for semiconductor lasers.

BACKGROUND OF THE INVENTION

In semiconductor laser structures, feedback mechanisms for achieving a lasing condition have generally been in the form of reflective mirror facets. These facets are created by cleaving or polishing prescribed planar surfaces about the active laser cavity.

More recently, feedback has been obtained by a periodic variation of the refractive index within an optical waveguide abutting the laser cavity. Such periodic variations are produced by corrugating a surface at or near the core of the optical waveguide. Lasers which utilize these corrugated surfaces are called distributed feedback lasers or distributed Bragg reflector lasers. See, for example, U.S. Pat. No. 3,760,292 issued to H. Kogelnik et al. on Sept. 18, 1973 with respect to distributed feedback lasers and also see S. Wang, "Principles of Distributed Feedback and Distributed Bragg-Reflector Lasers", IEEE J. of Quantum Electronics, Vol. QE-10, No. 4, pp. 413–427 (1974).

Distributed feedback lasers incorporate periodic corrugations within, as well as outside of, an active gain medium. Distributed Bragg reflector lasers include the corrugations only in passive media adjacent to the active gain medium. As such, the periodic structures of the distributed Bragg reflector laser perform a function of frequency selective and reflection, in contrast to non-frequency selective end reflection performed by planar mirror facets. But, because each Bragg reflector is in a high loss passive waveguide medium outside of the pumped active medium, the net gain of the distributed Bragg reflector laser is less than the gain of the active medium.

Several refinements of the fundamental distributed Bragg reflector laser structure have been proposed of Wang in the aforementioned publication and by Y. Suematsu et al. in Japan. J. of Appl. Phys., Vol. 17, No. 9, pp. 1599–1603 (1978), and Elect. Lett., Vol. 16, No. 12, pp. 455–456 and pp. 456–458 (1980). In the Wang publication, the structure utilizes butt joint coupling of the active medium to the passive waveguide and reflector arrangements. Suematsu et al. employ an integrated twin guide structure which requires phase coupling to occur between the active medium and the passive waveguide and reflector arrangement thereunder. In both of these distributed Bragg reflector laser structures, the active and passive media are composed of semiconductor materials from the same family of compounds. Furthermore, in the passive waveguide media, the semiconductor material exhibits a transparent, rather than absorptive, property with respect to the frequency of the laser output. Although these refinements have tended to increase the differential quantum efficiency of these distributed Bragg reflector lasers over previous distributed Bragg reflector laser structures, they have not significantly reduced the loss of the passive (unpumped) waveguide media.

SUMMARY OF THE INVENTION

In a heterostructure distributed Bragg reflector laser, substantial reduction of the loss experienced in the passive waveguide and reflector media is achieved with at least one multilayer waveguide comprised of a silicon dielectric compound having Bragg reflectors properly disposed thereon monolithically integrated with the active semiconductor medium. This arrangement not only exhibits a low loss per unit waveguide length but also maintains a high degree of frequency stability over a wide temperature range.

Composition of the silicon dielectric waveguide is varied for different embodiments of the invention. Cladding layers of the waveguide generally comprise silicon oxide which resembles silicon dioxide. A core layer is fabricated from either silicon nitride or a polyimide coating.

Each waveguide supports single mode propagation and utilizes mode profile matched, butt joint coupling to interface with the active medium region. Structural variations of the laser include collinear waveguides, non-collinear waveguides, or a waveguide and mirror facet. For the variation including the waveguide and mirror facet, non-collinear waveguides couple to the active medium through a Brewster window. The waveguide is on the opposite side of the active region from mirror facet.

BRIEF DESCRIPTION OF THE DRAWINGS

A more complete understanding of the invention may be obtained by reading the following description of specific illustrative embodiments of the invention in conjunction with the appended drawings in which.

DETAILED DESCRIPTION

Substantial theoretical and practical explanations have been set forth in numerous publications to explain the general physical structure and operation of distributed Bragg reflector lasers. Except where necessary, little attention will be paid herein to these particularities. Therefore, the interested reader is directed to at least some of the following publications: U.S. Pat. No. 3,760,292 issued to H. Kogelnik et al., U.S. Pat. No. 3,868,589 issued to S. Wang, U.S. Pat. Nos. 3,884,549 and 3,970,959 issued to S. Wang et al., and the above-cited technical papers of Wang and Suematsu.

Figure 1:
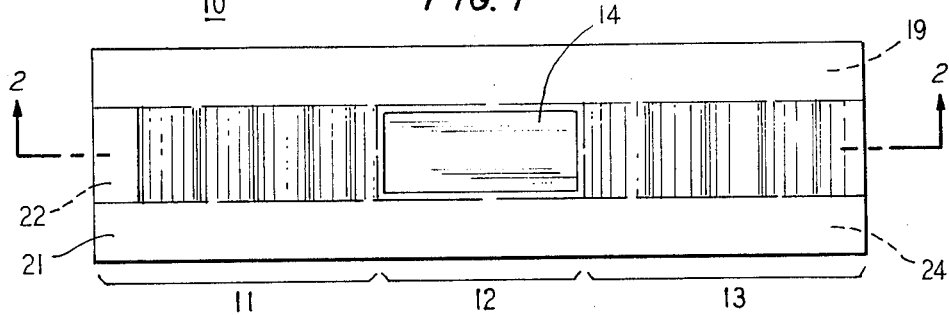
FIG. 1 is a top view of a distributed Bragg reflector laser which incorporates collinear, butt joint coupled, dielectric waveguides constructed in accordance with the principles of this invention.
Figure 2:
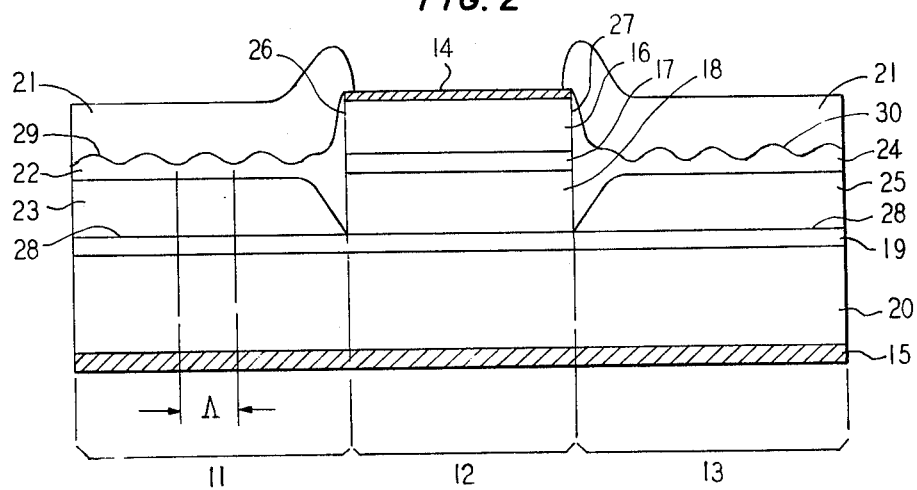
FIG. 2 is a cross-sectional view of the distributed Bragg reflector laser as observed through cutting plane 2—2 in FIG. 1.

FIG. 1 shows a top view of distributed Bragg reflector laser 10. Laser 10 is a single mode, stripe geometry, double heterostructure laser which includes three distinct regions of differing media, namely, passive waveguide medium regions 11 and 13, and active gain medium region 12. Metallic contact 14 provides means for attaching a source of electrical potential to pump a stripe area of active region 12 above a threshold level. Passive waveguide medium region 11 comprises a two-dimensional, single mode, dielectric optical waveguide having core layer 22, upper cladding layer 21, and lower cladding layer 23 (FIG. 2). Passive waveguide medium region 13 also comprises a two-dimensional, single mode, dielectric optical waveguide having core layer 24, upper cladding layer 21, and lower cladding layer 25 (FIG. 2).

In at least the stripe are under contact 14, active region 12 is comprised of alternating layers of III–V semiconductor material to form a double heterostructure pn junction. The dielectric waveguides and the double heterostructure pn junction are deposited and grown, respectively, on a semiconductor substrate layer (FIG. 2, layer 19). Mode-profile-matched, butt joint coupling is employed to optically connect active region 12 to both passive regions 11 and 13. At each active-to-passive region interface, optical power coupling is enhanced by interposing a thin layer of antireflective coating material between abutting surfaces of the active and passive regions.

Bragg reflectors, illustratively depicted in FIG. 1, are disposed at or near a core layer (21 or 24) in each passive waveguide region (11 and 13) substantially transverse to the propagation direction for optical energy in both passive waveguide regions. Each Bragg reflector comprises a corrugated surface which acts as a feedback mechanism within the particular waveguide region. Corrugations, which together form the corrugated surface, cause substantially time constant, spatially periodic perturbations to occur in the transmission characteristics of the respective passive medium. Each corrugation has dimensions, such as magnitude, and center-to-center spacing (FIG. 2, $/\backslash$) from adjacent corrugations sufficient to produce feedback to the optical energy to sustain oscillation at the desired wavelength $\lambda$, wherein $$/\backslash = \frac{\lambda}{2} = \frac{\lambda_0}{2n_{eff}}$$

and $\lambda_0$ is the free space wavelength of light and $n_{eff}$ is the effective refractive index in passive waveguide region 11 or 13 determined by the propagation constant of the waveguide normalized by the free space propagation constant. The condition described above produces a phenomena known as backward Bragg scattering. See the aforementioned Wang publications, as well as W. Ng et al., "Holographic Interference Lithography for Integrated Optics", IEEE Trans. Electron Devices, Vol. ED-25, pp. 1193–1200 (1978) and L. Johnson et al., "Generation of Periodic Surface Corrugations", Appl. Opt., Vol. 17, pp. 1165–1181 (1978), for information on the dimensions and shape (sinusoidal, sawtooth, triangular, or rectangular) of the corrugations. Corrugations forming the Bragg reflectors can extend over the entire length of each passive waveguide, as depicted in the figures, or can be located at the ends of the waveguides. Placement of the Bragg reflectors affects the normalized pumped length of the laser which is a ratio of the pumped length to the total length. Although certain reflector placements lower the net gain of the laser below some maximum, these placements do afford a higher degree of frequency stability versus injection current density. The length and strength of each Bragg reflector determined by the number of and magnitude of individual corrugations establishes the reflectance of the feedback mechanism.

The active and passive waveguides shown in FIG. 1 appear as a single longitudinal stripe. Waveguide core layers 22 and 24, as observed in FIG. 1 are collinear with reference to the respective central axes for optical energy propagation therein. Characteristics of the laser structure described above will be explained in more detail with reference to FIG. 2.

FIG. 2 is a cross-sectional view of monolithically integrated, distributed Bragg reflector laser 10 shown in FIG. 1. As described above, laser 10 comprises three distinct regions of interest, namely, passive regions 11 and 13 and active region 12. Each passive region includes a multilayer dielectric waveguide having a Bragg reflector disposed thereon. Active region 12 includes a semiconductor heterostructure pn junction capable of generating stimulated photoemissions when electrically pumped above a threshold level by potential source attached across metallic contacts 14 and 15.

The III–V semiconductor heterostructure in active region 12 is comprised of metallic stripe contact 14, upper cladding layer 16, active core layer 17, lower cladding layer 18, waveguide substrate layer 19, substrate layer 20, and metallic contact 15. Contact 14 defines a pumped stripe area within active region 12. Layers 19 and 20 extend beyond the longitudinal boundaries, that is, surfaces 26 and 27, of active region 12. Hence, the semiconductor material in regions 11 through 13 is geometrically described as a mesa. The dielectric waveguides in regions 11 and 13 abut surfaces 26 and 27 of the mesa as well as surface 28 of waveguide substrate layer 19.

In passive regions 11 and 13, the dielectric optical waveguide is a multilayer structure substantially comprised of a silicon dielectric compound. Each waveguide is monolithically integrated with the semiconductor heterostructure body. Bragg reflectors, shown as time constant, spatially periodic corrugations along corrugated surfaces 29 and 30, are disposed on or near each waveguide core layer. Although each Bragg reflector is shown directly on an upper surface (29, 30) of the corresponding waveguide core layer (22, 24), alternative embodiments of laser 10 or 10' can be constructed wherein the Bragg reflectors are situate either above the upper cladding layer or beneath the lower waveguide cladding layers. Furthermore, although the Bragg reflectors, as shown, extend for the entire length of each passive region, alternative embodiments of laser 10 or 10' can be constructed in which each Bragg reflector extends for a portion of the entire length at the end of a passive region.

In passive region 11 (13), the dielectric optical waveguide includes waveguide upper cladding layer 21 (21) waveguide core layers 22(24), corrugated surface 29(30) forming a Bragg reflector, and waveguide lower cladding layer 23(25). When viewed transverse to the propagation direction of optical energy in the waveguide, waveguide core layer 22 is defined by a T or inverted-T shape known as a rib waveguide and described below in more detail. Waveguide core layer 22 may also have a rectangular parallelepiped shape which is analyzed as a special case of a rib waveguide in the limit. In either case, it is important that the waveguide support single mode propagation while providing two-dimensional lateral confinement. Moreover, the waveguides are butt joint coupled and mode-profile-matched to the semiconductor structure in active region 12.

Waveguide upper cladding layer 21 and lower cladding layers 23 and 25 are substantially comprised of a silicon dielectric compound such as silicon oxide, $SiO_x$ ($x \sim 2$), which is amorphous and resembles silicon dioxide. Waveguide core layers 22 and 24 are comprised of either a polymeric material such as polyimide or a silicon dielectric compound such as silicon nitride, $Si_3N_4$.

For a III-V semiconductor heterostructure device such as distributed Bragg reflector laser 10, epitaxial growth of the device is usually performed on a (100) substrate in an InGaAsP/InP system or in an AlGaAs/GaAs system. This substrate configuration ensures availability of the $<01\bar{1}>$ axis as a desired direction for optical energy propagation.

Each laser (10 and 10') shown in the figures is grown by liquid phase epitaxy on a (100) substrate, substrate layer 20, in the following order: n-type waveguide substrate layer 19, n-type lower cladding layer 18, n-type or undoped active layer 17, and p-type upper cladding layer 16. The conductivity type for each layer may be reversed so that each p-layer becomes an n-layer and each n-layer becomes a p-layer. Further, an optional cap layer may be included above cladding layer 16 in an alternative embodiment of the heterostructure body. The embodiment shown in FIG. 2 is realized by omitting the growth of a cap layer from fabrication of the semiconductor heterostructure body.

Semiconductor materials for the heterostructure are chosen from the group of III-V compounds. In the InGaAsP/InP system, a binary III-V compound, InP, is employed for cladding layers 16 and 18 and for substrate 20. A quaternary III-V compound, $In_{1-y}Ga_yAs_xP_{1-x}$, is utilized for active layer 17, and waveguide substrate layer 19 wherein the alloy composition ratios x and y are chosen to produce a particular laser output wavelength ($\lambda$) or energy bandgap and lattice constant for the heterostructure. For a description of techniques for choosing x and y, see R. Moon et al, "Bandgap and Lattice Constant of GaInAsP as a Function of Alloy Composition", *J. Electron. Materials*, Vol. 3, p. 635 (1974). In the description which follows, exemplary composition ratios, $x=0.52$ and $y=0.22$, are selected to produce a wavelength of 1.3 $\mu$m (0.95 eV). It is important to note that the claimed invention is equally applicable when these ratios are varied to produce wavelengths in the range of 0.95 $\mu$m to 1.7 $\mu$m. For concentration ratios producing laser output wavelengths above 1.5 $\mu$m, it is necessary to grow a quaternary antimeltback layer between layers 16 and 17 during liquid phase epitaxial growth of the heterostructure. The presence of such an antimeltback layer requires the surface preparation described below to be modified only slightly, in terms of etching exposure times, to provide acceptable results.

For a heterostructure laser as shown in FIG. 2 in the InGaAsP/InP system, cladding layers 16 and 18 are approximately 1.5-3 $\mu$m thick, active layer 17 and waveguide substrate layer 19 are approximately 1000-3000 angstroms thick, and substrate 20 is approximately 75-100 $\mu$m thick. Of course, for simplicity and clarity of explanation, layer thicknesses in FIG. 2 are not necessarily drawn to scale.

In the AlGaAs/GaAs system, a binary III-V compound, GaAs, is employed for substrate 20. A ternary III-V compound, AlGaAs, is utilized for layers 16 through 19. Cladding layers 16 and 18 utilize $Al_rGa_{1-r}As$ and $Al_uGa_{1-u}As$, respectively; active layer 17 utilizes $Al_sGa_{1-s}As$; and waveguide substrate layer 19 utilizes $Al_wGa_{1-w}As$. Since cladding layer 18 is a different material composition from substrate layer 20, layer 19 may be omitted from the crystal growth. Alloy composition ratios r, s, u and w are chosen to produce a particular laser output wavelength or energy bandgap and lattice constant for the heterostructure semiconductor body. In general, compositions ratios s and w are chosen to be less than ratios r and u, and for symmetry purposes r and u are equal. A description of techniques for choosing the compositions ratios of the various AlGaAs layers is given by H. Kressel et al. in "Semiconductor Lasers and Heterojunction LEDs", pp. 357-363 (Academic Press: New York 1977).

Layer thicknesses for an AlGaAs/GaAs heterostructure shown in FIG. 2 are substantially identical to those described above in relation to the InGaAsP/InP system, except that optional substrate layer 19 is in the range 0.2 to 1.8 $\mu$m.

A heterostructure mesa is formed in region 12 by photolithographic masking and wet chemical etching techniques. Preferential and material selective etchants are well adapted for this purpose. See K. Furuya et al., "Crystallographic Facets Chemically Etched in InGaAsP/InP for Integrated Optics", *Elect. Lett.* Vol. 17, pp. 582-583 (1981) and L. A. Coldren et al., "Etched Mirrors, Grooves and Surfaces for GaInAsP/InP Integrated Optical Devices Using Stop-Etch Crystal Planes", *Proc. of Topical Meeting on Integrated and Guided-Wave Optics*, Paper WB1 (1982). The etchants and techniques described in the publications cited above are useful for exposing smooth, mirror-quality facets at crystallographic planes. For an optical energy propagation direction along $<01\bar{1}>$, two preferred surfaces for mirror facets are surface 26 corresponding to the ($0\bar{1}1$) plane, for example, and surface 27 corresponding to the ($01\bar{1}$) plane, for example.

In addition to exposing the mirror facets of the heterostructure mesa, it is important that a substantially flat planar surface be exposed to serve as a substrate layer for the dielectric waveguide. This plane is shown in FIG. 2 as surface 28 of layer 19.

Regardless of the semiconductor heterostructure system being employed, smoothness and flatness dimensions of surface 28 are important to subsequent fabrication of the dielectric optical waveguide thereon. As will become apparent below, the smoothness and flatness dimensions of surface 28 affect the smoothness and flatness dimensions of the walls of the dielectric optical waveguide. Excessive scattering losses result for a waveguide having rough walls. It is generally regarded that the smoothness of the waveguide walls be controlled to a tolerance of a fraction of the desired optical wavelength over a dimension of about five wavelengths. See, D. Marcuse, *Bell System Technical Journal*, Vol. 48, p. 3187 et seq. (1969), and also J. E. Goell et al., "Ion Bombardment Fabrication of Optical Waveguides Using Electron Resist Masks", *Appl. Phys. Lett.*, Vol. 21, pp. 72-73 (1972). Because the shape of the waveguide walls is directly determined by the shape of surface 28, tolerance control of the smoothness of surface 28 and waveguide substrate layer 19 is required during the epitaxial growth of the semiconductor heterostructure crystal.

After surfaces 26, 27 and 28 have been sufficiently exposed by using the techniques described above, at least surfaces 26 and 27 are coated with a thin film of anti-reflective material by an evaporative processing technique to avoid Fabry-Perot operation caused by interfacial reflections and to ensure a proper degree of coupling between active region 12 and passive waveguide regions 11 and 13. Anti-reflective thin film coatings exhibit an index of refraction, $n_{ar}$, equal to the geometrical average of the effective indices of refraction for the active and passive waveguides in regions 12 (active) and 11 and 13, respectively. That is, $$n_{ar} = (n_A^* n_P^*)^{\frac{1}{2}}, \quad (1)$$

where $n_A^*$ is the effective index of refraction of the waveguide in active region 12 and $n_P^*$ is the effective index of refraction of the waveguide in either passive region 11 or passive region 13. Each affective index of refraction is given by the propagation constant of the actual waveguide normalized by the propagation constant of free space. The thickness of the anti-reflective coating layer, $l_{ar}$, is given by the expression, $$l_{ar} = \frac{\lambda_o}{4 n_{ar}}, \quad (2)$$

where $\lambda_o$ is the optical wavelength in free space. Materials which are suitable for evaporation onto surfaces 26 and 27 in an InGaAsP/InP system to form an anti-reflective coating layer are metal oxides such as $Ta_2O_5$ and $TiO_5$.

Passive regions 11 and 13 include two-dimensional single mode dielectric optical waveguides coupled to active region 12 with mode-profile-matched butt joints. Each waveguide comprises an elongated guiding core layer of dielectric material substantially surrounded by a medium having a lower index of refraction than the core layer. As is seen in rib waveguide structures, waveguide core layers 22 and 24 need not be completely surrounded by dielectric material to create a lower refractive index medium around each core and, therefore, two dimensional confinement. Rather, only the effective index of refraction around the stripe area in each core layer is required to be lower than effective refractive index of the stripe area of the corresponding core layer. Hence, a rib waveguide structure is sufficient to provide two-dimensional, single mode optical confinement. Properties of rib waveguides are explained by F. K. Reinhart et al., "Transmission Properties of Rib Waveguides Formed by Anodization of Epitaxial GaAs on $Al_xGa_{1-x}As$ Layers", *Appl. Phys. Lett.* Vol. 24, pp. 270–272 (1974).

Fabrication of a dielectric waveguide on a III–V semiconductor heterostructure layer has been described in K. Furuya et al., "A Novel Deposit/Spin Waveguide Interconnection (DSWI)-Technique of Semiconductor Integrated Optics", Proc. of Topical Mtg. of Integrated and Guided-Wave Optics, PDP-8 (1982) and in copending U.S. patent application, Ser. No. 337,142, K. Furuya, filed on Jan. 5, 1982.

Formation of a dielectric optical waveguide on surface 28 of waveguide substrate layer 19 begins with controlled, directional deposition of a dielectric material, such as silicon oxide ($SiO_x$, $x\sim 2$), to form waveguide lower cladding layers 23 and 25 only on surface 28. The dielectric material chosen to form waveguide lower cladding layers 23 and 25 exhibits an index of refraction lower than that of waveguide core layers 22 and 24. Deposition of the dielectric material is required to be highly controlled in order to avoid having the waveguide lower cladding layer dielectric material attach to surfaces 26 or 27 and, in particular, to surfaces 26 or 27 above an interface between semiconductor layers 17 and 18.

Two low temperature techniques have been developed for controlled, directional deposition of $SiO_x$ on layer 19. One technique involves thermal evaporation of a silicon monoxide, SiO, source in an oxygen atmosphere. Another technique involves electron beam evaporation of a silicon dioxide, $SiO_2$, source in a vacuum.

In the thermal evaporation technique, the semiconductor body is placed in an oxygen ($O_2$) atmosphere of approximately $2.0 \times 10^{-4}$ mbar. Current is controllably supplied to a tantalum filament for evaporating the SiO source. It is this current which controls the evaporation rate of the source SiO and also the deposition rate of $SiO_x$ on surface 28 of layer 19. As stated above, deposition of $SiO_x$ is directional in that particles of SiO and $SiO_2$ are in a substantially collision-free environment and attach only on a (100) plane, i.e., surface 28 and other surfaces parallel thereto. An exemplary deposition rate which yields a controlled, directional deposition for waveguide lower cladding layers 23 and 25 is approximately 5 angstroms per second or 0.03 $\mu$m/min. The $O_2$ atmosphere can be varied to change the proportion of SiO to $SiO_2$ in layers 23 and 25. Of course, such variations of the $O_2$ atmosphere also affect the index of refraction for layers 23 and 25 as SiO has a refractive index of 1.90 and $SiO_2$ has a refractive index of 1.46. For the exemplary $O_2$ atmosphere given above, the resulting stoichiometry of layers 23 and 25 is $SiO_x$ ($x\sim 2$), a heterogeneous composition of SiO and $SiO_2$ resembling $SiO_2$ with an index of refraction of 1.50.

The second deposition technique, as stated above, involves electron beam evaporation of a $SiO_2$ source in a vacuum. An exemplary vacuum useful for this technique is approximately $10^{-6}$ torr. In this technique, the semiconductor body is placed in an evacuated chamber with a crucible containing the $SiO_2$ source. An electron beam of sufficient power is focused on the source causing evaporation of $SiO_2$. The power of the beam is carefully monitored to control the deposition rate, whereas the vacuum pressure is controlled to produce a directional flow of $SiO_2$ only to those exposed surfaces parallel to surface 28 ((100) plane). Throughout this deposition process, the semiconductor body is at room temperature. Hence, the bond which occurs at the interface between layers 19 and 23 or 25 is an incomplete chemical bond.

Waveguide lower cladding layers 23 and 25 are adjacent to layer 18 of the semiconductor heterostructure body, but do not completely abut surface 26 and 27, respectively, of layer 18. Upper surfaces of layers 23 and 25 exhibit essentially the same flatness and smoothness dimensions, that is, planarity, as surface 28 of the waveguide substrate except in a narrow region near surfaces 26 and 27 where layers 23 and 25 are tapered. This narrow region of taper extends not more than 0.3 $\mu$m from surfaces 26 or 27.

Layers 23 and 25 act as lower cladding layers for the dielectric optical waveguide. In general, layers 23 and 25 are each approximately as thick as layer 18. In order to avoid radiation loss by evanescent coupling through the waveguide into layer 19, it is desirable for layers 23 and 25 to have an approximate thickness of at least 1 $\mu$m or, preferably, 2.0 $\mu$m. The thickness of layers 23 and 25 also determines the position of a passive waveguide core layer, to be formed later, with respect to active core layer 17. Layers 23 and 25 should each be sufficiently thick in order to maximize the transmission coefficient from semiconductor core layer 17 to each abutting passive dielectric optical waveguide core layer (layers 22 and 24), that is, mode profile matching between layer 17 and the dielectric waveguides. Mode profile matching is described below in more detail.

Waveguide core layers 22 and 24 are formed on the exposed surface of layers 23 and 25, respectively, and surfaces 26 and 27, respectively. Layers 22 and 24 are each comprised of a dielectric material having an index of refraction higher than the refractive indices of layers 23 and 25. Waveguide layers 22 and 24 act as core layers of the passive waveguide. As such, it is desirable for the dielectric material chosen for layers 22 and 24 to exhibit optical transparency to the wavelength or wavelengths of light intended for propagation therein.

In one exemplary embodiment of this invention, an organic polyimide coating material such as PYRALIN (a trademark of E. I. DuPont de Nemours and Company) polyimide coating, PI2555, is employed for forming dielectric waveguide core layers 22 and 24. See, also, U.S. Pat. Nos. 3,179,614 and 3,179,634 issued to W. Edwards on Apr. 20, 1965. PYRALIN polyimide coating has a refractive index of approximately 1.7 and is transparent after 100 percent imidization to optical wavelengths in the range 0.85 to 1.8 $\mu$m.

Dielectric waveguide core layers 22 and 24 are formed by performing the following steps with PYRALIN polyimide coating. The semiconductor mesa and dielectric waveguide layer is treated with a material to promote adhesion of layers 22 and 24 to surfaces 26 and 27 and exposed surfaces of layers 23 and 25. One exemplary adhesion promoter is sold under the product name VM-651 by E. I. DuPont de Nemours and Company. Next, the polyimide coating film is applied to the semiconductor and dielectric body. Removal of air bubbles present in the polyimide coating film is accomplished by then placing the semiconductor mesa and dielectric waveguide body in a vacuum chamber for a short period of time. At this point the polyimide coating film forming layers 22 and 24 is in complete contact with at least surfaces 26 and 27 and layers 23 and 25. Subsequently, the monolithically integrated structure is placed on a rotating table or spinner at room temperature, where it is held in place by a vacuum and rotated at a speed in the range 3000 to 7000 rpm. for approximately 2 minutes. Speed of rotation and viscosity of the polyimide coating film determines the thickness of layers 22 and 24 in the <100> direction. An exemplary range of thickness for polyimide coating film as layer 22 or 24 is approximately 0.3 to 1.2 $\mu$m.

After layers 22 and 24 are spin-coated on layers 23 and 25, respectively, and prior to complete curing, the polyimide coating film is partially cured by baking the film to effect less than 100 percent imidization, for example, at 130 degrees Centigrade for about 5 minutes. Partially cured polyimide is solvable in certain solutions and, therefore, is receptive to shaping or patterning by photolithographic techniques.

Patterning of partially cured core layers 22 and 24 is performed using a standard photoresist such as AZ1-35OJ to produce an appropriate shape, such as a longitudinal stripe, and transverse width ($<01\bar{1}>$ direction) for the core layer of the dielectric waveguides. The photoresist is developed. Then, selected portions of layers 22 and 24, after patterning and prior to curing, are completely or partially removed by etching with AZ303 developer or oxygen plasma to form, as an example, the rib waveguide structure described above.

Periodic corrugations forming Bragg reflectors can be engraved or etched on waveguide core layers 22 and 24 prior to complete curing of these layers. Interference or holographic fabrication techniques have been disclosed in the Ng et al. and Johnson et al. publications cited above as well as in U.S. Pat. No. 3,689,264 issued to E. A. Chandross et al. on Sept. 5, 1972 and in an article by K. Pennington et al. entitled "Halographic Techniques for Fabrication of Optical Waveguide Networks", *IBM Tech. Disclosure Bull.* Vol. 14, No. 5, pp. 1493-1494 (1971). By using these techniques, it is possible to adjust the period and location of the Bragg reflectors.

The remaining unetched portions of layers 22 and 24 are then fully cured. Curing of the spun polyimide coating film is accomplished by baking the monolithically integrated structure for a time, and at a temperature, sufficient to permit 100 percent imidization. In one example, curing was accomplished by baking at 200 degrees Centigrade for about 2 hours. Upper surfaces of layers 22 and 24 are substantially flat and smooth throughout passive dielectric waveguide regions 11 and 13.

Cladding layer 21 is a third layer of dielectric material applied in each passive waveguide region over core layers 22 and 24. The index of refraction for layer 21 is less than the indices of refraction for layers 22 and 24 to provide suitable optical confinement of each core layer. Furthermore, cladding layer 21 passivates those portions of distributed Bragg reflector laser 10 contacted by it. Deposition or spin coating are alternative techniques for fabricating layer 21. In an example from practice, thermal evaporation of silicon monoxide, SiO, in an oxygen atmosphere is used to deposit a $SiO_x (x \sim 2)$ layer, as cladding layer 21 on core layers 22 and 24. The thermal evaporation technique is described above in relation to fabrication of cladding layers 23 and 25.

It should be noted that for a polyimide/silicon oxide waveguide, as described above, the effective index of refraction of the passive waveguide $n_p^*$ is in the range 1.6 to 1.7 depending on layer thicknesses.

Figure 3:
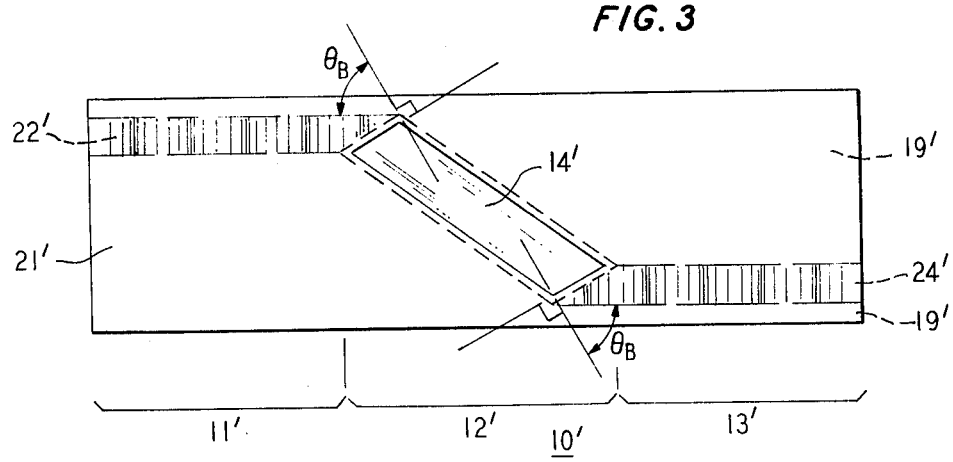
FIG. 3 is a top view of a distributed Bragg reflector laser which incorporates non-collinear, butt joint coupled, dielectric waveguides constructed in accordance with the principles of this invention.

FIG. 3 shows distributed Bragg reflector laser 10' having noncollinear dielectric optical waveguides in passive regions 11' and 13' butt joint coupled to active region 12' through Brewster windows. Waveguide substrate layer 19' supports the heterostructure mesa under metallic stripe contact 14' as well as the dielectric waveguide of which core layers 22' and 24' and cladding layer 21' are shown. Brewster angle $\oplus_B$ is defined as $$\theta_B = \tan^{-1} \frac{n_P^*}{n_A^*}$$

where $n_P^*$ and $n_A^*$ are the effective refractive indices of the passive and active regions, respectively.

Figure 4:
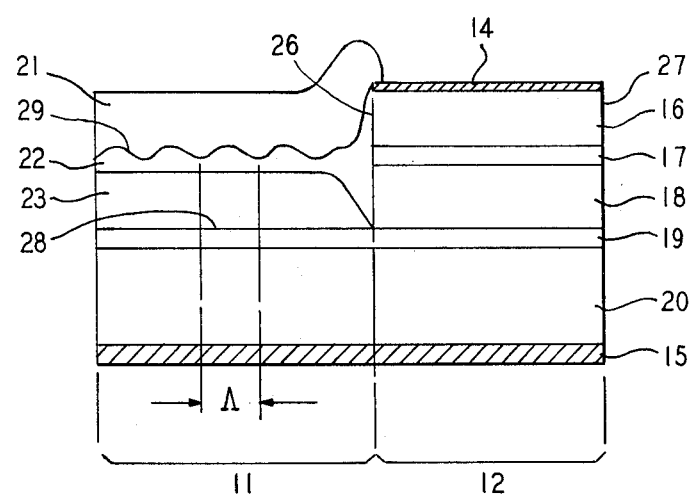
FIG. 4 is a cross-sectional view of an alternative embodiment of a distributed Bragg reflector laser incorporating only a single passive dielectric waveguide.

FIG. 4 shows an alternative embodiment of the distributed Bragg reflector laser shown in FIG. 2. The laser structure of FIG. 4 operates as an optical source. This structure is identical to that of FIG. 2 with respect to passive region 11 and active region 12 except that surface 27 of active region 12 is not covered by an anti-reflective coating. Hence, surface 27 serves as a mirror-like reflector or feedback mechanism for producing sufficient feedback of optical energy to sustain optical frequency oscillations. Again, it is important to note that surfaces 26 and 27 are substantially planar surfaces, parallel to each other, occupying opposite sides of active region 12.

Fabrication of the laser shown in FIG. 4 may be accomplished in a manner similar to laser 10. Moreover, laser 10 shown in FIG. 2 may be constructed with active region 12 extending for twice the necessary length along a longitudinal axis. Cleaving the laser at the midpoint of active region 12 on a plane parallel to surface 26 (FIG. 2) will produce two lasers of the type shown in FIG. 4.

It has been estimated that for a distributed Bragg reflector laser embodying the principles of this invention the loss per unit length of passive waveguide is on the order of 0.5 dB/mm whereas semiconductor waveguide distributed Bragg reflector lasers exhibit, at best, 5.0 dB/mm loss per unit length.

Another advantage of the present distributed Bragg reflector laser is that the frequency selectivity of the laser is enhanced because the thermal coefficient of expansion for the silicon dielectric compounds in the waveguides is low.

Finally, an advantage apparent from the fabrication technique utilized herein is that the lasers are constructed at or near room temperature. Therefore, monolithic integration does not disturb the crystalline integrity of the semiconductor material. Hence, the laser devices constructed in accordance with the technique described herein have improved reliability and lifetime over other lasers produced at higher temperatures. Also, the absence of additional crystal growth steps in formation of the passive waveguides for the present invention increases obtainable yield levels over processes requiring the additional crystal growth.

What is claimed is:

1. An optical source arrangement (FIG. 4) comprising a semiconductor substrate (19,20), a passive waveguide medium (11), a Group III–V semiconductor heterostructure (12) abutting the passive medium at a first planar surface (26) of the semiconductor heterostructure, the semiconductor heterostructure having a plurality of different layers arranged for guiding optical energy through substantially a single layer (17), means (14,15) for pumping the semiconductor heterostructure, and first (27) and second (29) feedback means integrated with the semiconductor heterostructure and the passive medium, respectively, to produce sufficient feedback of optical energy to sustain optical frequency oscillations, the first feedback means including a second planar surface of the semiconductor heterostructure parallel to and opposite from the first planar surface, the second feedback means comprising a Bragg reflector disposed substantially transverse to a propagation direction of optical energy in the passive medium, the arrangement characterized in that
the semiconductor substrate is comprised of Group III–V semiconductor material and is monolithically integrated with the semiconductor heterostructure, and the passive medium is comprised of a dielectric silicon compound and monolithically integrated with the semiconductor heterostructure.

2. The arrangement defined in claim 1 wherein the passive medium includes at least first (23), second (22), and third (21) waveguide layers, the second layer being interposed between the first and third waveguide layers and having a central longitudinal axis substantially parallel to the propagation direction of optical energy in the passive medium.

3. The arrangement defined in claim 2 wherein the first and third waveguide layers are comprised of silicon oxide, $SiO_x$, wherein x is approximately equal to 2.

4. The arrangement defined in claim 3 wherein the second waveguide layer is comprised of polyimide.

5. The arrangement defined in claim 3 wherein the second waveguide layer is comprised of silicon nitride, $Si_3N_4$.

6. A distributed Bragg reflector laser arrangement (10 or 10') comprising a semiconductor substrate (19,20), first (11) and second (13) passive media, a Group III–V semiconductor heterostructure (12) interposed between the first and second passive media, the semiconductor heterostructure having a plurality of different layers arranged for guiding optical energy through substantially a single layer (17), means (14,15) for pumping the semiconductor heterostructure, and first and second feedback means (22,29; 24, 30) integrated with the first and second passive media, respectively, each said feedback means comprising a corrugated surface (29, 30) having a plurality of corrugations for causing substantially time constant spatially periodic perturbations in the transmission characteristics of the respective passive medium for a predetermined distance along the length thereof, said corrugations being disposed substantially transverse to a propagation direction of optical energy in the respective passive medium, said corrugations being of sufficient magnitude and being spaced from adjacent corrugations by an integral multiple of one-half wave lengths of the optical frequency oscillations to produce sufficient feedback of the optical energy to sustain oscillations, the laser arrangement characterized in that,
the semiconductor substrate is comprised of Group III–V semiconductor material and is monolithically integrated with the semiconductor heterostructure, and the first and second passive media are each substantially comprised of a dielectric silicon compound and monolithically integrated with the semiconductor heterostructure .

7. The arrangement of claim 6 wherein the first and second passive media each separately include at least first (23, 25), second (22, 24) and third (21) waveguide layers, the second waveguide layer being interposed between the first and third waveguide layers in each passive medium and having a central longitudinal axis substantially parallel to the propagation direction of optical energy in the corresponding passive medium.

8. The arrangement defined in claim 7 wherein the first and third waveguide layers in both the first and second passive media are comprised of silicon oxide, $SiO_x$, wherein x is approximately equal to 2.

9. The arrangement defined in claim 8 wherein the second waveguide layer in both the first and second passive media is comprised of polyimide.

10. The arrangement defined in claim 8 wherein the second waveguide layer in both the first and second passive media is comprised of silicon nitride, $Si_3N_4$.

11. A distributed Bragg reflector laser arrangement (10 or 10') comprising a semiconductor substrate (19,20), first (11) and second (13) passive media, a Group III–V semiconductor heterostructure (12) interposed between the first and second passive media, the semiconductor heterostructure having a plurality of different layers arranged for guiding optical energy through substantially a single layer (17), means (14,15) for pumping the semiconductor heterostructure, and first and second feedback means (22, 29; 24, 30) integrated with the first and second passive media, respectively, each said feedback means comprising a Bragg reflector disposed substantially transverse to a propagation direction of optical energy in the respective passive medium to produce sufficient feedback of the optical energy to sustain optical frequency oscillations, the laser arrangement characterized in that, the semiconductor substrate is comprised of Group III-V semiconductor material and is monolithically integrated with the semiconductor heterostructure, and the first and second passive media are each substantially comprised of a dielectric silicon compound and monolithically integrated with the semiconductor heterostructure.

* * * * *